United States Patent
Leigh et al.

(10) Patent No.: US 11,442,231 B2
(45) Date of Patent: Sep. 13, 2022

(54) AIRFRAME-INTEGRATED OPTICAL MIDPLANE

(71) Applicant: HEWLETT PACKARD ENTERPRISE DEVELOPMENT LP, Houston, TX (US)

(72) Inventors: Kevin B. Leigh, Houston, TX (US); John R. Grady, Cypress, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 32 days.

(21) Appl. No.: 16/811,010

(22) Filed: Mar. 6, 2020

(65) Prior Publication Data
US 2021/0278599 A1    Sep. 9, 2021

(51) Int. Cl.
*G02B 6/38* (2006.01)
*H05K 7/20* (2006.01)

(52) U.S. Cl.
CPC ......... *G02B 6/3814* (2013.01); *G02B 6/3825* (2013.01); *G02B 6/3897* (2013.01); *H05K 7/20145* (2013.01); *H05K 7/20736* (2013.01)

(58) Field of Classification Search
None
See application file for complete search history.

(56) References Cited

U.S. PATENT DOCUMENTS

| | | | |
|---|---|---|---|
| 7,722,359 B1 | 5/2010 | Frangioso, Jr. | |
| 7,822,313 B2 * | 10/2010 | Rapp | G02B 6/4453 385/137 |
| 9,510,483 B1 | 11/2016 | West et al. | |
| 10,430,251 B2 | 10/2019 | Ragupathi et al. | |
| 2006/0228912 A1 | 10/2006 | Morlion et al. | |
| 2007/0293137 A1 | 12/2007 | Crippen et al. | |
| 2012/0170191 A1 | 7/2012 | Jensen | |
| 2013/0016947 A1 * | 1/2013 | Roitberg | G02B 6/44 385/60 |

FOREIGN PATENT DOCUMENTS

| | | |
|---|---|---|
| CA | 2349494 | 9/2004 |
| CN | 109032299 | 12/2018 |

* cited by examiner

*Primary Examiner* — Michelle R Connelly
(74) *Attorney, Agent, or Firm* — Nolte Intellectual Property Law Group

(57) ABSTRACT

An optical midplane includes an airframe having a first side on which first modules are disposed and a second side on which second modules are disposed. The airframe is to provide for optimized airflow through the first modules disposed on the first side. A plurality of optical connectors are disposed at respective locations on the airframe to provide optical connectivity. Optical connectivity is provided between at least one of any first module disposed on the first side of the airframe and any second module disposed on the second side of the airframe, any first modules disposed on the first side of the airframe, and any second modules disposed on the second side of the airframe.

20 Claims, 13 Drawing Sheets

AIRFRAME-INTEGRATED OPTICAL MIDPLANE

BACKGROUND

Certain computing systems are composed of modular units called "modules". These modules may contain components of a server that are interconnected. In some example systems, each module contains a specific type of component (e.g., a computational component, storage, a switch, etc.). Multiple modules are sometimes interconnected via a midplane.

BRIEF DESCRIPTION OF THE DRAWINGS

The present disclosure is best understood from the following detailed description when read with the accompanying Figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1A:
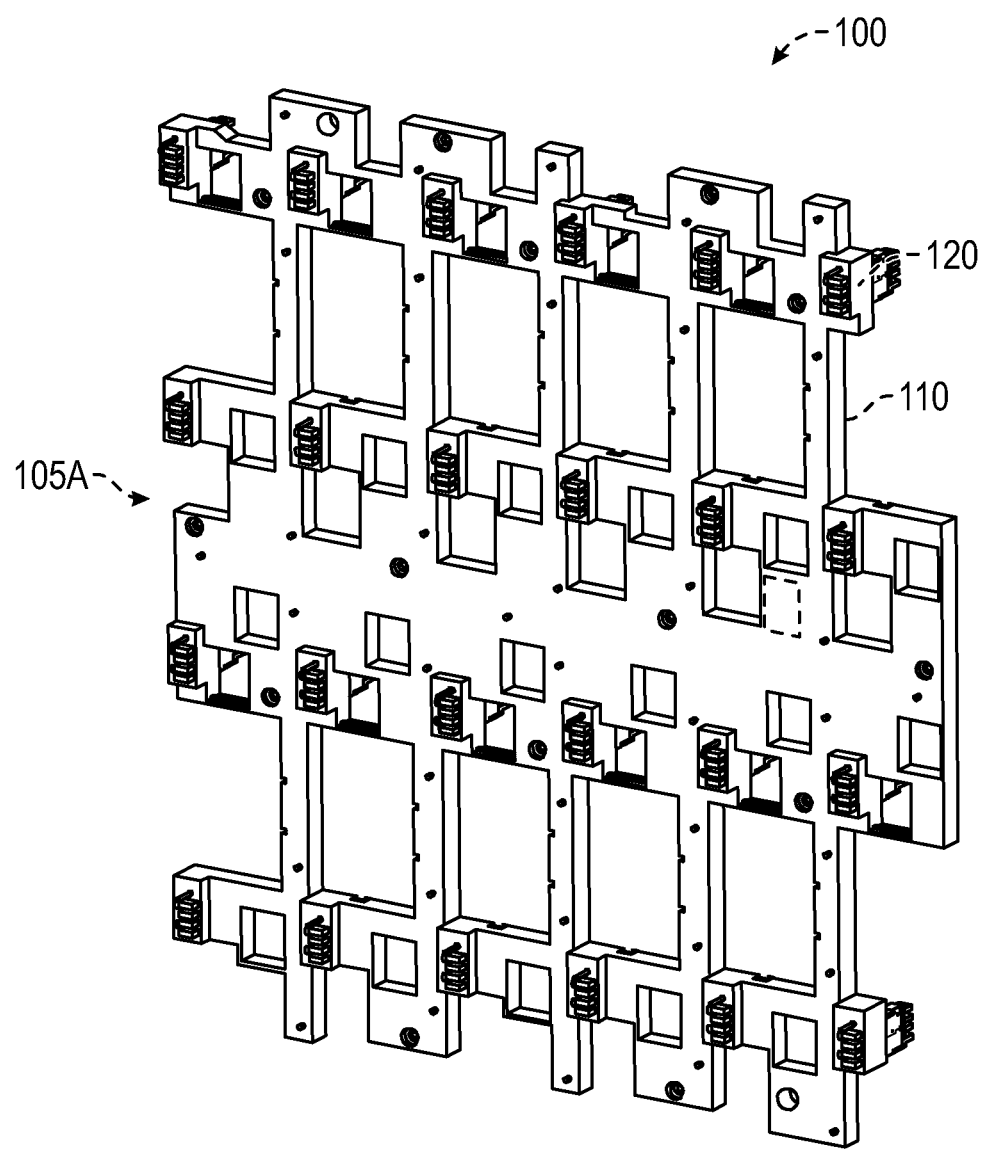
FIG. 1A is a front perspective view of an optical midplane according to one or more examples.

Illustrative examples of the subject matter claimed below will now be disclosed. In the interest of clarity, not all features of an actual implementation are described in this specification. It will be appreciated that in the development of any such actual implementation, numerous implementation-specific decisions may be made to achieve the developers' specific goals, such as compliance with system-related and business-related constraints, which will vary from one implementation to another. Moreover, it will be appreciated that such a development effort, even if complex and time-consuming, would be a routine undertaking for those of ordinary skill in the art having the benefit of this disclosure.

A modular computing system includes modules interconnected via a midplane. As referred to herein, the term "modules" may refer to components of a server, such as computational components, such as server blades, interconnect components, such as network switches and interconnect link units, etc. Further, as used herein, the term "midplane" may refer to a communication bus that provides for connection of the modules on one side to modules on an opposite side.

Typically, a midplane provides electrical connectivity between modules on one side and modules on another side. While a midplane may be provisioned to allow for optical connectivity between modules on opposite sides, such connectivity is limited by space on the midplane.

Some existing modular computing systems include half-height server blades, and the blades are separated into upper and lower portions relative to the midplane. These portions are referred to as hemispheres. The blades on one side of the midplane are electrically and optically connectable to modules on the other side of the midplane, such as network switches. Electrical connectivity is made possible between server blades and network switches that are in the same and in different hemisphere using trace routes within the midplane printed circuit board (PCB). However, due to space limitations on the midplane, optical connectivity is only possible between server blades and network switches that are in the same hemisphere using optical blindmate connectors directly mating through holes on the midplane within each hemisphere to connect the server blades to the network switches. Thus, in some existing modular computing systems, optical connectivity is not possible between server blades and network switches in different hemispheres, between server blades on the same side of the midplane, or between network switches on the same side of the midplane. In addition, as space on the midplane is limited, the number of optical connections that can be implemented is limited. Such limitations on optical connectivity limit the available bandwidth and capabilities for redundancy.

With emerging applications and technologies, such as accelerators, machine learning, artificial intelligence, high-density processors and fabric components, data rates are expected to exceed 56 Gbps per lane, where a network port may use four lanes, i.e., 224 Gbps per port bandwidth. There is thus an ever growing need to provide larger amounts of bandwidth.

Electrical signals are likely to be limited in data rates beyond 56 Gbps per lane across PCB traces, especially for server blades and network switches to be connected across different hemispheres via the midplane. Accordingly, to address the increasing need for bandwidth, an optical midplane is provided. The optical midplane disclosed herein utilizes space within an airframe that is used to optimize airflow through modules, such as server blades, by including optical connectors at locations within the airframe. The optical connectors may be interconnected by optical fibers which may be placed within structural cavities of the airframe to provide additional optical connectivity between modules, such as server blades and network switches. This allows for redundant connections between hemispheres and increased bandwidth and flexibility in optical connections among the modules.

According to some examples, an optical midplane includes an airframe and a plurality of optical connectors. The airframe has a first side on which first modules are disposed and a second side on which second modules are disposed. The airframe provides for optimized airflow through the first modules disposed on the first side. The plurality of optical connectors are disposed at respective locations on the airframe. The plurality of optical connectors provide optical connectivity between at least one of: any first module disposed on the first side of the airframe and any second module disposed on the second side of the airframe, any two first modules disposed on the first side of the airframe, and any two second modules disposed on the second side of the airframe.

According to some examples, an assembly is provided that includes an airframe, a plurality of optical connectors, and optical fibers. The airframe has a first side on which first modules are disposed in a first hemisphere and a second hemisphere and a second side on which second modules are disposed in the first hemisphere and the second hemisphere. The airframe provides for optimized airflow through the first modules disposed on the first side. The plurality of optical connectors connect a first module disposed in the first hemisphere on the first side of the airframe to a second module disposed in the first hemisphere on the second side of the airframe, and the first module disposed in the first hemisphere on the first side of the airframe to another second module disposed in the second hemisphere on the second side of the airframe. The optical connectors are interconnected by the optical fibers.

According to some examples, a system is provided that includes an electrical midplane, an airframe, and a plurality of optical connectors. The airframe has a first side on which first modules are disposed and a second side on which second modules are disposed. The airframe provides for optimized airflow through the first modules disposed on the first side. The plurality of optical connectors are disposed at respective locations on the airframe, and the second side of the airframe rests on the electrical midplane such that the optical connectors extend through the electrical midplane towards the second modules. The plurality of optical connectors provide optical connectivity between at least one of: any first module disposed on the first side of the airframe and any second module disposed on the second side of the airframe, any first modules disposed on the first side of the airframe, and any second modules disposed on the second side of the airframe.

Figure 1B:
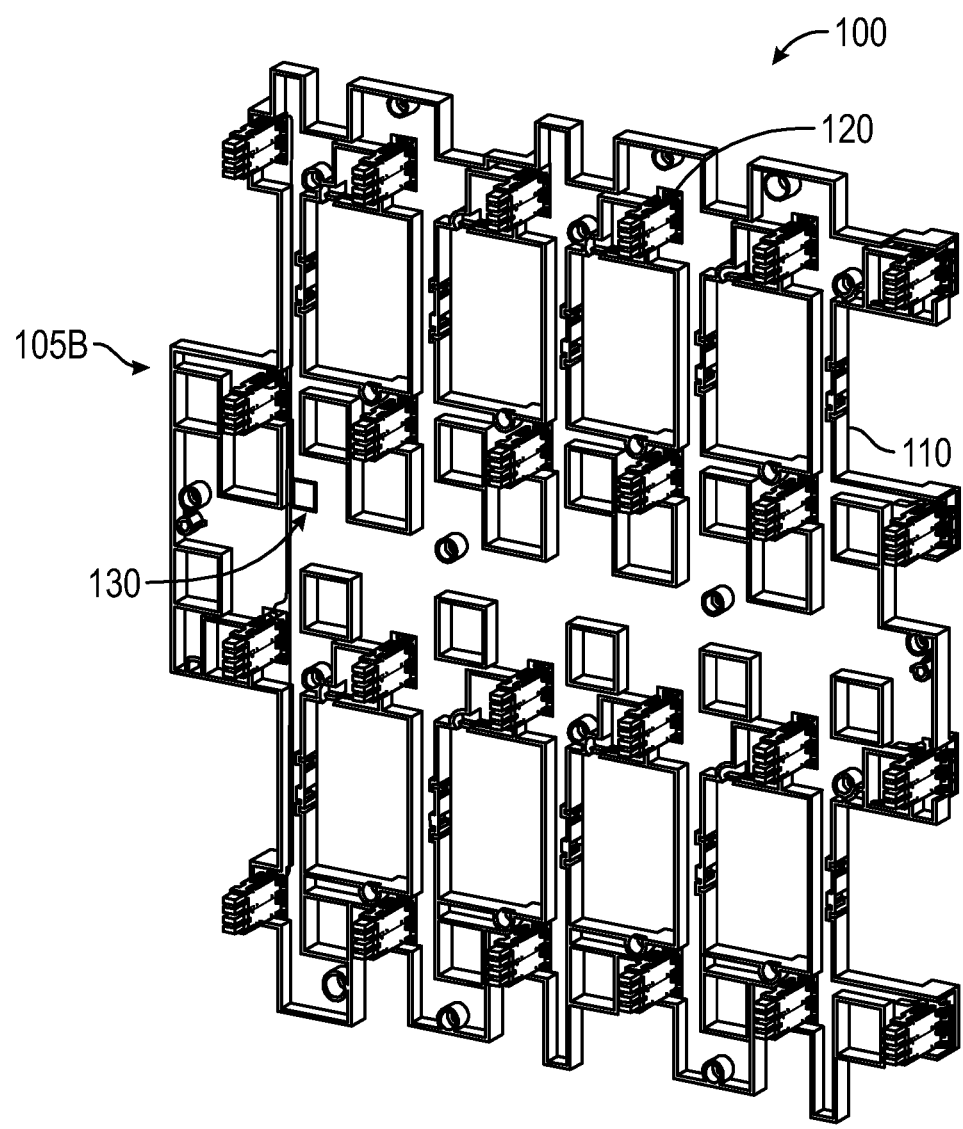
FIG. 1B is a rear perspective view of the optical midplane of FIG. 1A.

FIGS. 1A and 1B respectively depict a front perspective view and a rear perspective view of an optical midplane 100 according to one or more examples. The optical midplane 100 has a first side 105A depicted in FIG. 1A as a front side relative to the optical midplane 100 and a second side 105B depicted in FIG. 1B as a rear side relative to the optical midplane 100. First modules and second modules (not shown) are disposed on the first side 105A and the second side 105B, respectively.

The optical midplane 100 includes an airframe 110 that provides airflow through first modules disposed on the first side 105A. Air is exhausted through fans (not shown) on the second side of the airframe 105B. This is described in further detail below with reference to FIGS. 3A and 3B.

The optical midplane 100 also includes a plurality of optical connectors 120 disposed at respective locations on the airframe 110. The optical connectors 120 couple to the first modules and the second modules to provide optical connectivity between: any first module disposed on the first side 105A of the airframe 110 and any second module disposed on the second side 105B of the airframe 110, any first modules disposed on the first side 105A of the airframe 110, and any second modules disposed on the second side 105B of the airframe 110.

As shown in FIG. 1B, a tag 130 may be disposed on the airframe 110 to store information corresponding to a connection scheme among the optical connectors 120. This is described in further detail below with reference to FIGS. 3A and 3B.

The first modules and the second modules disposed respectively on the first side 105A and the second side 105B of the airframe 110 may be separated into hemispheres, and the optical connectors 120 may provide optical connectivity within the same hemisphere and across hemispheres. This is described in more detail below with reference to FIGS. 2A and 2B.

Figure 2A:
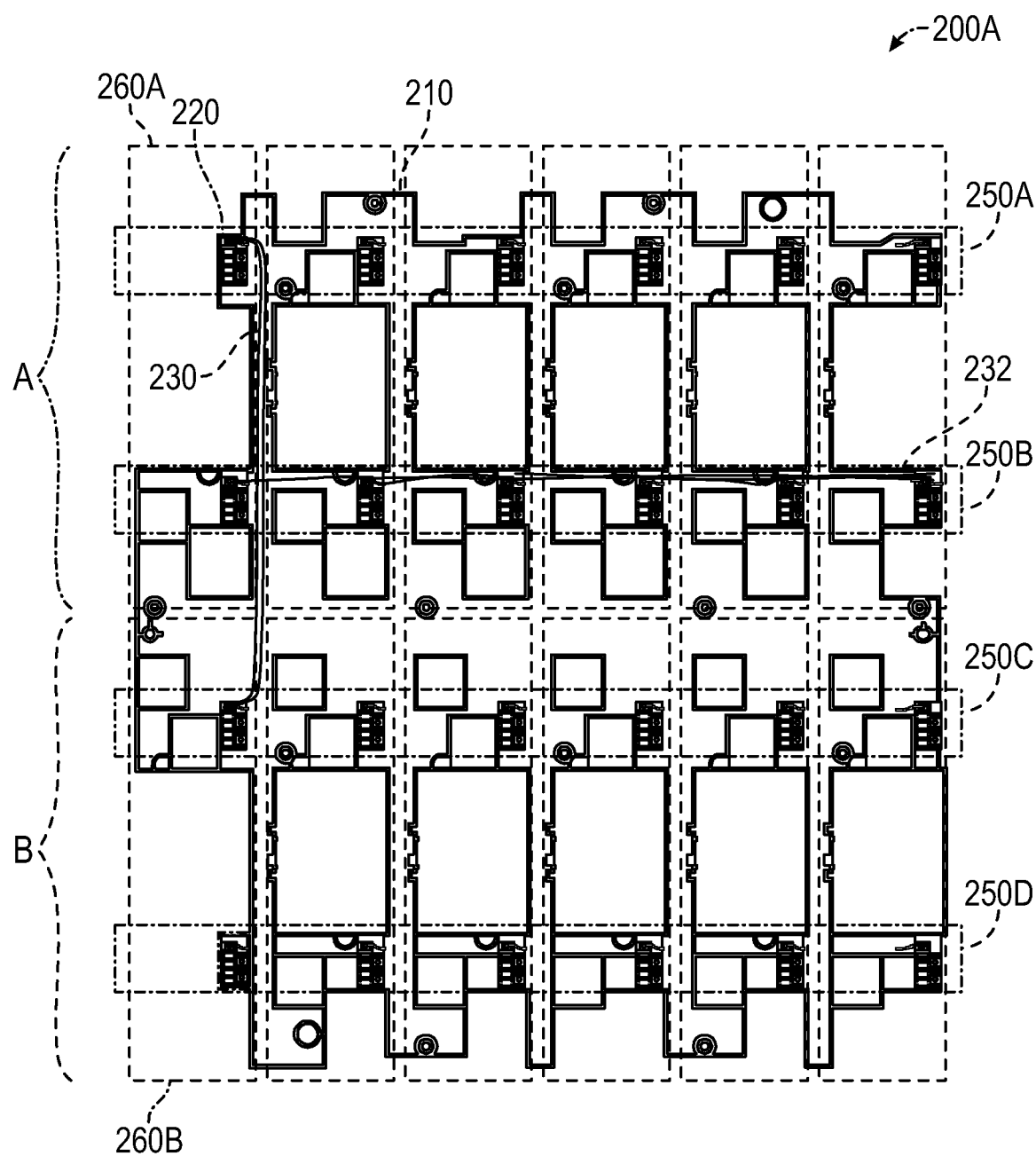
FIG. 2A illustrates an assembly according to one or more examples in a front, plan view.

FIG. 2A illustrates an assembly 200A according to one or more examples. The assembly 200A includes an airframe 210 and a plurality of optical connectors 220. First modules 260A and 260B disposed on a first side of the airframe 210 are represented by dashed lines, and second modules 250A, 250B, 250C, and 250D disposed on a second side of the airframe 210 are represented by dashed lines. As can be seen from FIG. 2A, the first modules 260A and the second modules 250A and 250B are disposed in a first hemisphere A, while the first modules 260B and the second modules 250C and 250D are disposed in a second hemisphere B. According to illustrative examples, considering the first modules 260A and 260B as server blades, these hemispheres A and B may correspond to portions of a blade enclosure that contain half-height server blades.

The assembly 200A also includes optical fibers 230 and 232. The optical fibers 230 and 232 may be placed within structural cavities of the airframe 210. The optical fibers 230 interconnect optical connectors 220 in a vertical direction relative to the airframe 210, across first and second hemispheres A and B. The optical fibers 232 interconnect optical connectors 220 in a horizontal direction relative to the airframe 210, within the same hemisphere. Although not shown, optical fibers may also be provided to interconnect optical connectors in a direction perpendicular relative to the airframe 210.

In the example shown in FIG. 2A, the optical fiber 230 may interconnect optical connectors 220 to connect a second module 250A disposed in the first hemisphere A and another second module 250C disposed in the second hemisphere B. The optical fiber 230 may also interconnect optical connectors 220 to connect a first module 260A disposed in the first hemisphere A and another first module 260B disposed in the second hemisphere B.

As further shown in FIG. 2A, the optical fibers 232 may interconnect optical connectors 220 to connect any of the first modules 260A disposed in the first hemisphere A. Although not shown, it should be appreciated that optical fibers may also be provided to interconnect optical connectors 220 to connect any of the first modules 260B in the second hemisphere B.

Figure 2B:
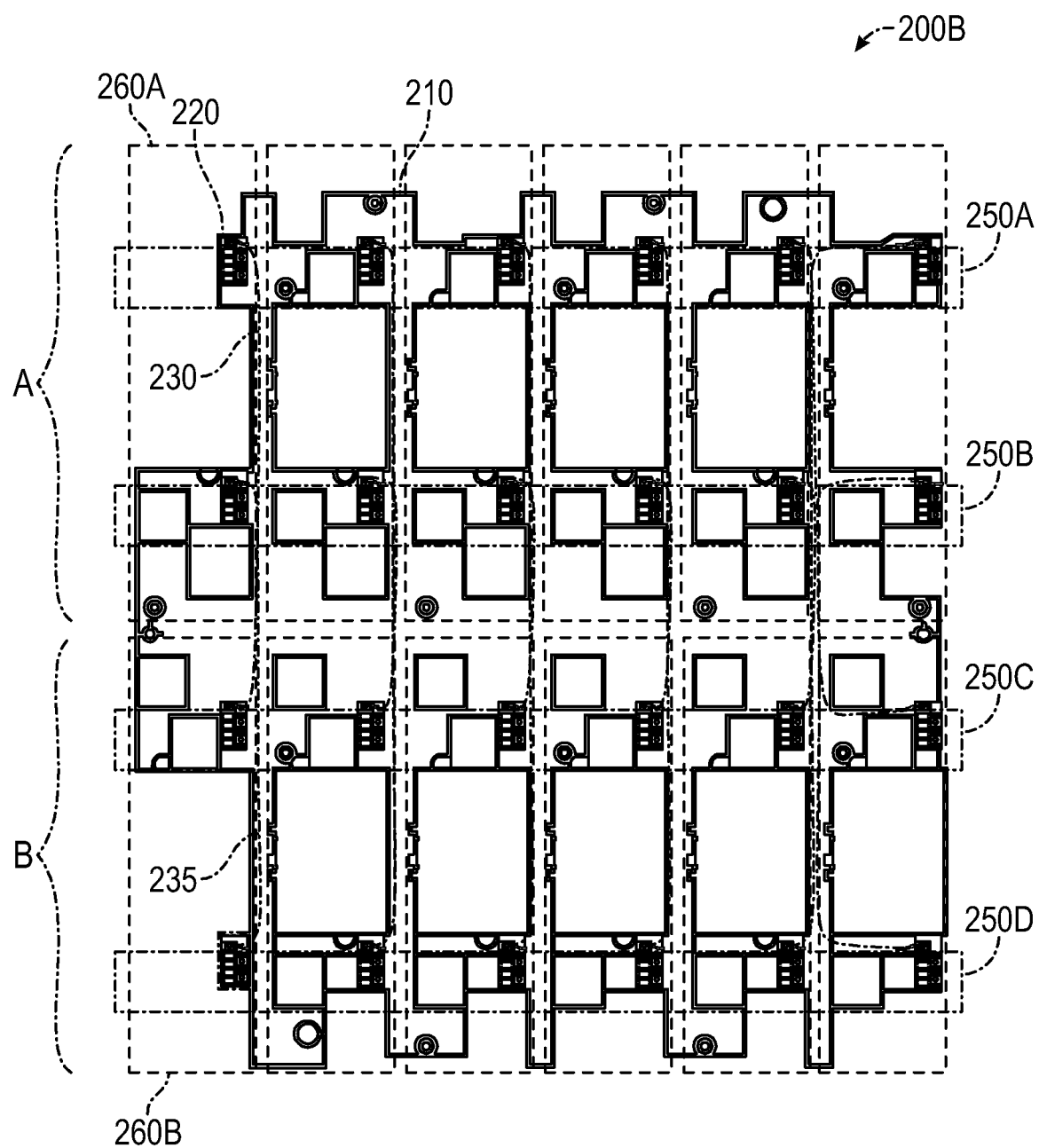
FIG. 2B illustrates the assembly of FIG. 2A in a rear, plan view.

FIG. 2B illustrates an assembly 200B according to one or more examples. The assembly 200B is similar to the assembly 200A, except that the assembly 200B includes an optical fiber 235 which may be placed within structural cavities of the airframe 210. In the example shown in FIG. 2B, the optical fiber 235 may interconnect optical connectors 220 to connect the second module 250B disposed in the first hemisphere A and another second module 250D disposed in the second hemisphere B. The optical fiber 235 may also interconnect optical connectors 220 to connect a first module 260A disposed in the first hemisphere A and another first module 260B disposed in the second hemisphere B. Although not shown, optical fibers may also be provided to interconnect two optical connectors 220 that are connected to second modules in the same hemisphere. Further, although not shown, optical fibers may be provided to interconnect two optical connectors that are respectively connected to any of the first modules 260A and 260B and any of the second modules 250A, 250B, 250C, and 250D.

Although not shown in FIGS. 2A and 2B, optical fibers Using optical fibers to connect optical connectors 220 across the first and second hemispheres A and B and within the same hemisphere allows optical connectivity to be provided between: any of the first modules 260A and 260B and any of the second modules 250A, 250B, 250C, and 250C, any of the first modules 260A and 260B, and any of second modules 250A, 250B, 250C, and 250D.

Figure 3A:
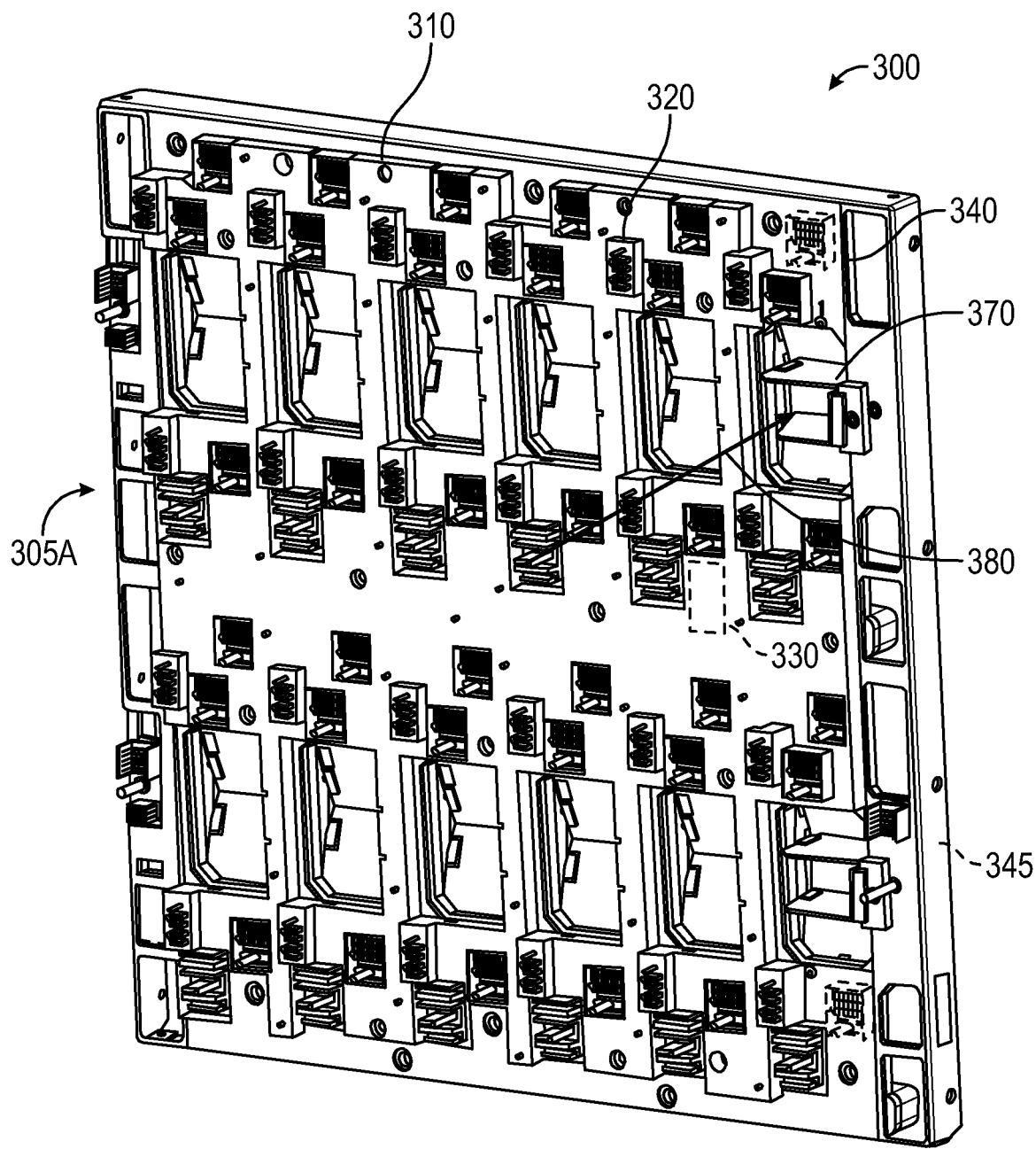
FIG. 3A is a front perspective view of a system according to one or more examples.
Figure 3B:
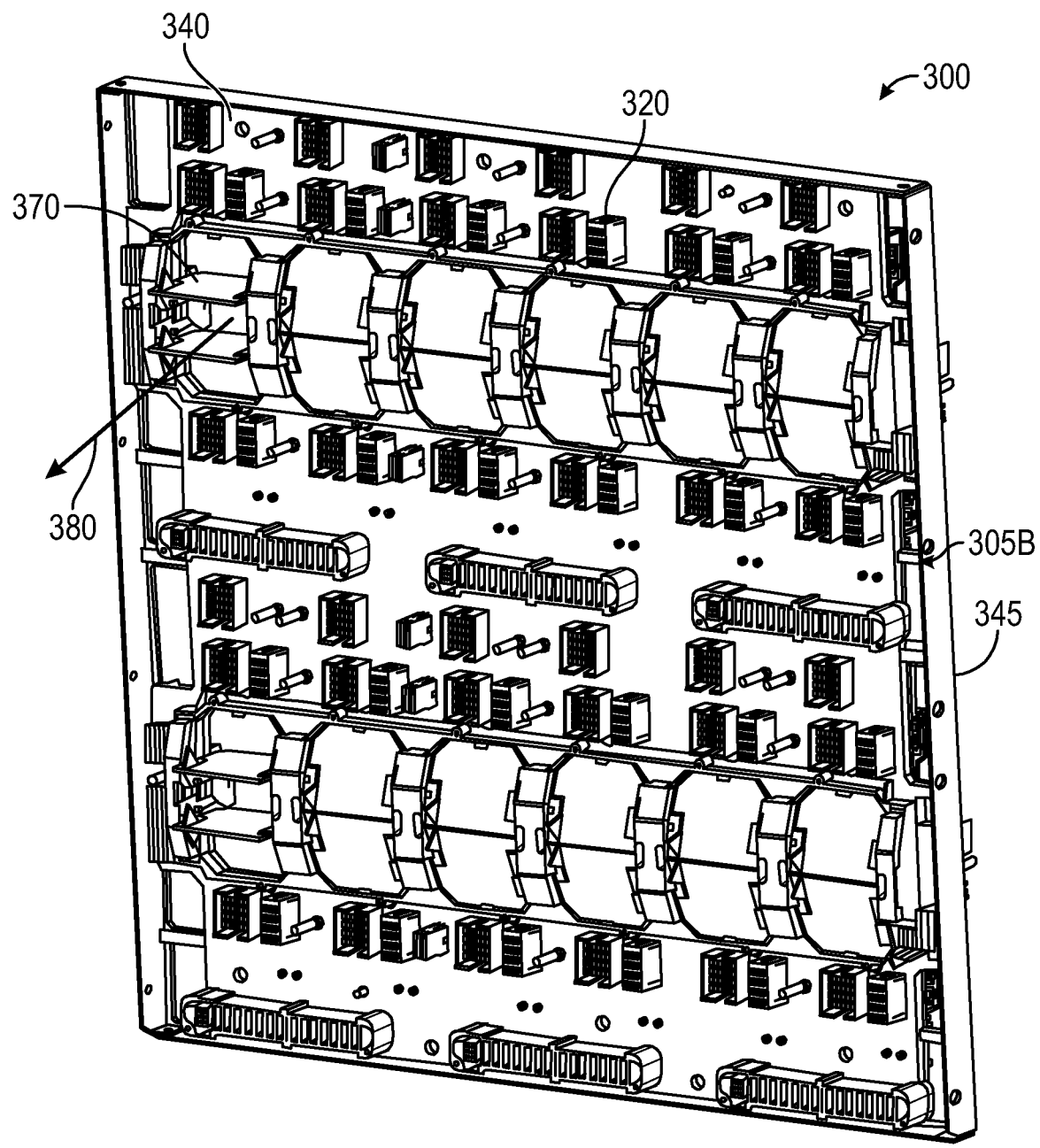
FIG. 3B is a rear perspective view of the system of FIG. 3A.

FIGS. 3A and 3B respectively depict a front perspective view and a rear perspective view of a system 300 according to one or more examples. The system 300 includes an airframe 310 having a first side 305A depicted as a front side in FIG. 3A and a second side 305B depicted as a rear side in FIG. 3B. First modules and second modules (not shown) are disposed on the first side 305A and the second side 305B, respectively.

In some examples, the system 300 also includes an electrical midplane 340 coupled to the second side 305B of the airframe 310, such that the airframe 310 is attached on a front side of the electrical midplane 340. The airframe 310 and the electrical midplane 340 may be attached to a base 345.

The airframe 310 provides for optimized airflow through the first modules disposed on the first side 305A. Air flows through shutters 370 on the electrical midplane 340 to which the airframe 310 is coupled. The shutters 370 open when first modules are connected, thus cooling the first modules. Air is exhausted through fans (not shown) on the second side 305B of the airframe 310. The fans may be positioned between second modules disposed on the second side 305B. The airframe 310 also provides airflow through air vents on the exterior sides, towards the ends of the first modules. That airflow enters the second modules disposed on the second side 305B of the airframe 305B and exhausts through the fans on the second side. In this manner, the airframe 310 provides two regions of airflow to be cleanly divided between the first side 305A and the second side 305B of the airframe 310.

Although not shown, there may be a gasket on the airframe 310 to provide an air-tight seal between the airframe 310 and the first modules. The arrows 380 indicate the direction of airflow through the first modules and the airframe 310.

The system 300 also includes a plurality of optical connectors 320 disposed at respective locations on the airframe 310. The second side 305B of the airframe 310 rests on the electrical midplane 340, such that the optical connectors 320 extend through the electrical midplane 340 towards the second modules to provide optical connectivity between: any first module disposed on the first side 305A of the airframe 310 and any second module disposed on the second side 305B of the airframe 310, any first modules disposed on the first side 305A of the airframe 310, and any second modules disposed on the second side 305B of the airframe 310.

A tag 330, represented in FIG. 3A by dashed lines, may be disposed on the airframe 310 to store information corresponding to a connection scheme of the optical connectors 320. Such information may include, for example, the type and number of optical connectors 320 disposed on the airframe 310, how the optical connectors 320 are connected to each other, the types of optical fibers, the number of optical signal transmission paths in each optical connector 320, loss characteristics of optical signal transmission paths in each optical connector 320, etc. Information from the tag 330 may be read by a controller (not shown) installed on the electrical midplane 340. The information from the tag 330 may be read via a wired connection (e.g., the tag 330 may mate with contact pins on the controller on the electrical midplane 340). Optionally, the information from the tag 330 may be read wirelessly (e.g., the information in the tag 330 may be detected by an antenna on the electrical midplane 340 using a radio frequency connection, a Near Field Communication connection, etc.).

Figure 4:
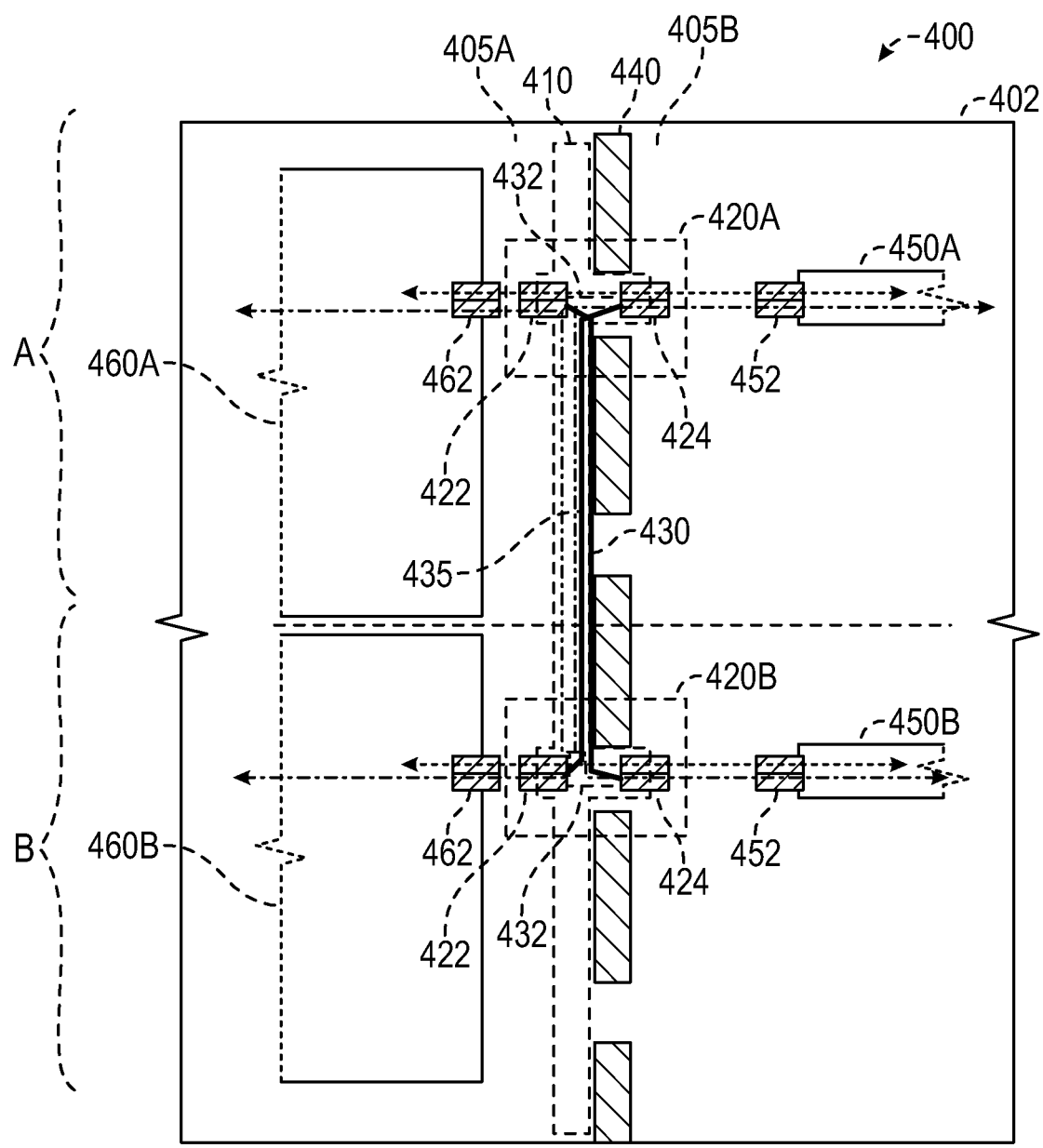
FIG. 4 illustrates a cross-sectional schematic view of an assembled modular computing system enclosed in a frame according to one or more examples.

FIG. 4 illustrates a cross-sectional schematic view of a modular computing system 400 enclosed in a frame 402 according to one or more examples. The modular computing system 400 includes an airframe 410 coupled to an electrical midplane 440. The modular computing system 400 also includes optical connectors 420A and 420B disposed on the airframe 410 and extending through the electrical midplane 440. A first module 460A and another first module 460B are disposed on a first side 405A of the airframe 410. A second module 450A and another second module 450B are disposed on a second side 405B of the airframe 410.

As can be seen from FIG. 4, the first module 460A and the second module 450A are disposed in a first hemisphere A, and the other first module 460B and the other second module 450B are disposed in a second hemisphere B. According to illustrative examples, considering the first modules as server blades, these hemispheres A and B may correspond to portions of a blade enclosure that contain half-height server blades.

According to one example, the optical connectors 420A and 420B include respective fix-mounted blindmate connectors 422 and 424. The respective blindmate connectors 422 couple to respective float-mounted blindmate connectors 462 included in the first module 460A and the other first module 460B disposed on the first side 405A of the airframe 410. The respective blindmate connectors 424 couple to respective float-mounted blindmate connectors 452 included in the second module 450A and the other second module 450B disposed on the second side 405B of the airframe 410. Respective optical fibers 432 connect the respective fix-mounted blindmate connectors 422 and 424.

As can be seen in FIG. 4, the optical connector 420A provides optical connectivity between the first module 460A disposed in the first hemisphere A on the first side 405A of the airframe 410 to the second module 450A disposed in the first hemisphere A on the second side 405B of the airframe 410 via the optical fiber 432 connecting the fix-mounted blindmate connectors 422 and 424 in the optical connector 420A. Similarly, the optical connector 420B provides optical connectivity between the other first module 460B disposed in the second hemisphere B on the first side 405A of the airframe 410 to the other second module 450B disposed in the second hemisphere B on the second side 405B of the airframe 410 via the optical fiber 432 connecting the fix-mounted blindmate connectors 422 and 424 in the optical connector 420B.

The modular computing system 400 also includes optical fibers 430 and 435 interconnecting the optical connectors 420A and 420B. In particular, the optical fiber 430 interconnects the fix-mounted blindmate connector 422 in the optical connector 420A to the fix-mounted blindmate connector 424 in the optical connector 420B. Similarly, the optical fiber 435 interconnects the fix-mounted blindmate connector 422 in the optical connector 420B to the fix-mounted blindmate connector 424 in the optical connector 420A. In this manner, the optical fiber 430 interconnects the optical connectors 420A and 420B to provide optical connectivity between the first module 460A disposed in the first hemisphere A on the first side 405A of the airframe 410 to the second module 450B disposed in the second hemisphere B on the second side 405B of the airframe 410. Similarly, the optical fiber 435 interconnects the optical connectors 420B and 420A to provide optical connectivity between the other first module 460B disposed in the second hemisphere B on the first side 405A of the airframe 410 and the other second module 450A disposed in the first hemisphere A on the second side 405B of the airframe 410.

Figure 5:
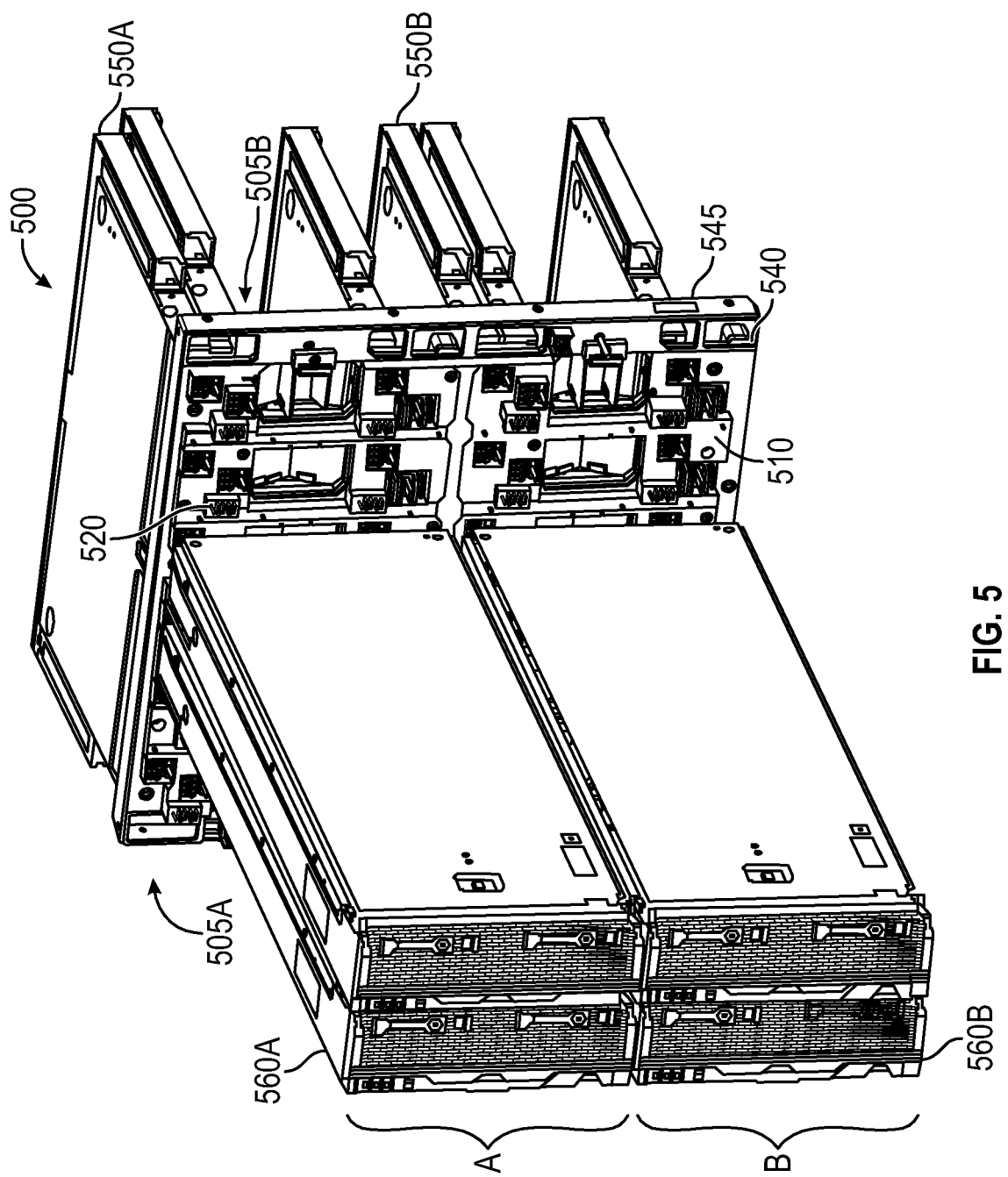
FIG. 5 illustrates a perspective view of an unenclosed, assembled modular computing system according to one or more examples.

FIG. 5 illustrates a perspective view of an unenclosed, assembled modular computing system 500 according to one or more examples. As shown in FIG. 5, the modular computing system 500 includes an airframe 510 coupled to an electrical midplane 540. The airframe 510 and the electrical midplane 540 are attached to a base 545. The modular computing system 500 also includes first modules 560A and 560B connected to the airframe on a first side 505A and second modules 550A and 550B connected to the airframe 510 on the second side 505B via the electrical midplane 540. As shown in FIG. 5, the first modules 560A and the second modules 550A are disposed in a first hemisphere A, and the first modules 560B and the second modules 550B are disposed a second hemisphere B. The airframe 510 provides for optimized airflow through the first modules 560A and 560B disposed on the first side 505A of the airframe 510.

The modular computing system 500 also includes optical connectors 520 disposed at respective locations on the airframe 510 and extending through the electrical midplane 540. The optical connectors 520 couple to the first modules 560A and 560B and the second modules 550A and 550B. The optical connectors 520 provide optical connectivity between any of the first modules 560A and 560B disposed on the first side 505A of the airframe 510 and any of the second modules 550A and 550B disposed on the second side 505B of the airframe 510. The optical connectors 520 further provide optical connectivity between any of the first modules 560A and 560B disposed on the first side 505A of the airframe 510 and any of second modules 550A and 550B disposed on the second side 505B of the airframe 510.

Figure 6A:
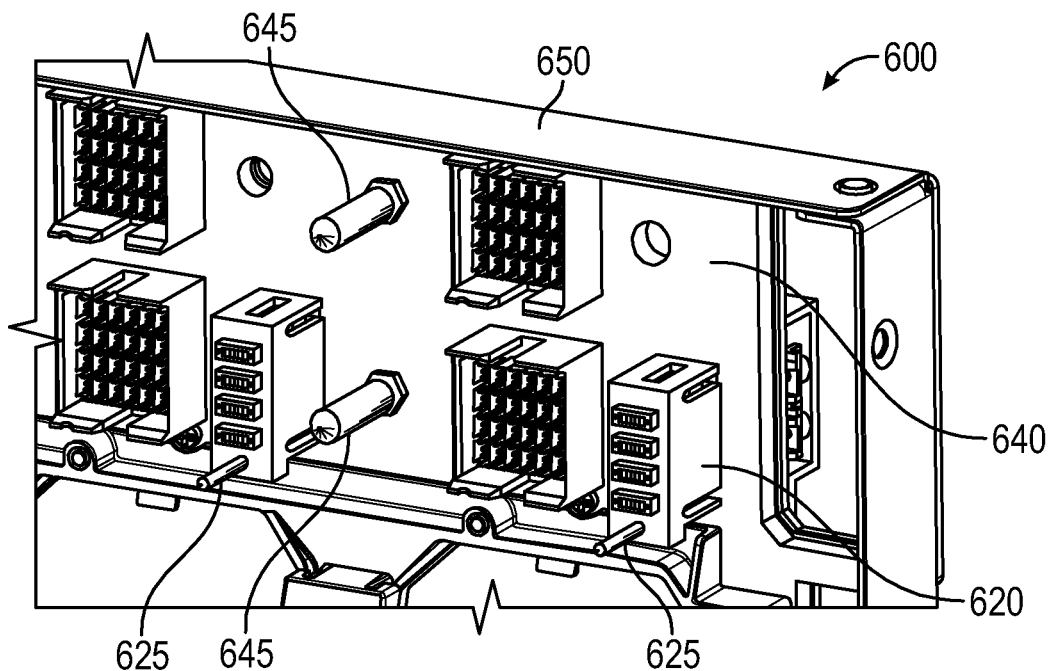
FIG. 6A illustrates a partial perspective view of a system according to one or more examples.
Figure 6B:
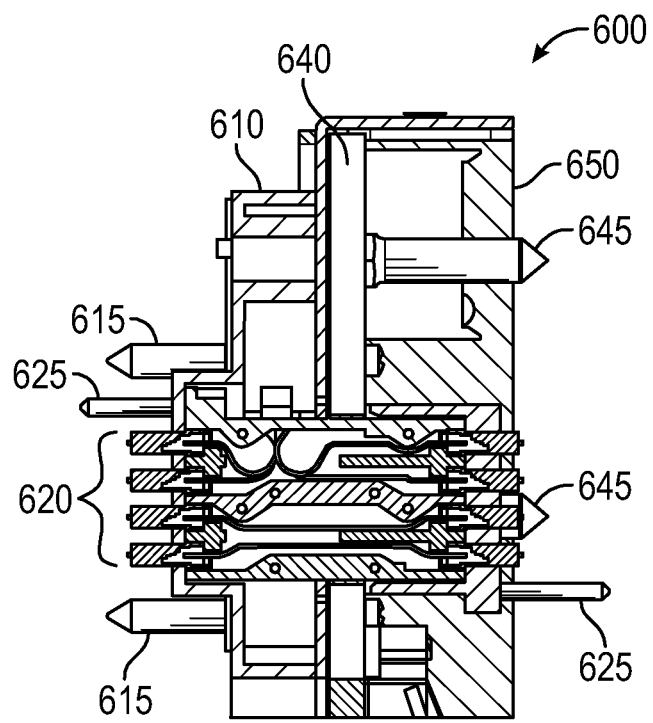
FIG. 6B illustrates a partial cross-sectional view of a system according to one or more examples.

FIGS. 6A and 6B respectively illustrate a partial rear perspective view and a partial cross-sectional view of a system 600 according to one or more examples. As shown in FIG. 6A, the system 600 includes a plurality of optical connectors 620. As shown in FIG. 6B, the plurality of optical connectors 620 are disposed at respective locations on the airframe 610 and extend through the electrical midplane 640. The airframe 610 and the electrical midplane 640 are attached to a base 650. The optical connectors 620 provide optical connectivity between: any first module disposed on a first side of the airframe 610 and any second module disposed on the second side of the airframe 610, any first modules disposed on the first side of the airframe 610, any second modules disposed on the second side of the airframe 610.

As shown in FIGS. 6A and 6B, to facilitate alignment of the electrical midplane 640 relative to second modules disposed on the second side of the airframe 610, the system 600 includes electrical midplane alignment components 645 on the electrical midplane 640. These electrical midplane alignment components 645 may include for example, pins extending from the electrical midplane 640 towards the second modules.

As shown in FIG. 6B, to facilitate alignment of the electrical midplane 640 relative to first modules disposed on the first side of the airframe 610, the system 600 includes electrical midplane alignment components 615. These components 615 may include, for example, pins extending through the airframe 610 towards the first modules.

As shown in FIGS. 6A and 6B, to facilitate alignment of the optical connectors 620 with the first modules and the second modules, the system 600 further includes optical connector alignment components 625 disposed on opposite sides of the optical connectors 620 to provide alignment of the optical connector 620 relative to the first modules and the second modules. Optical connector alignment components 625 may include, for example, pins respectively extending from opposites sides of the optical connectors 620 towards the first modules and the second modules.

Figure 7A:
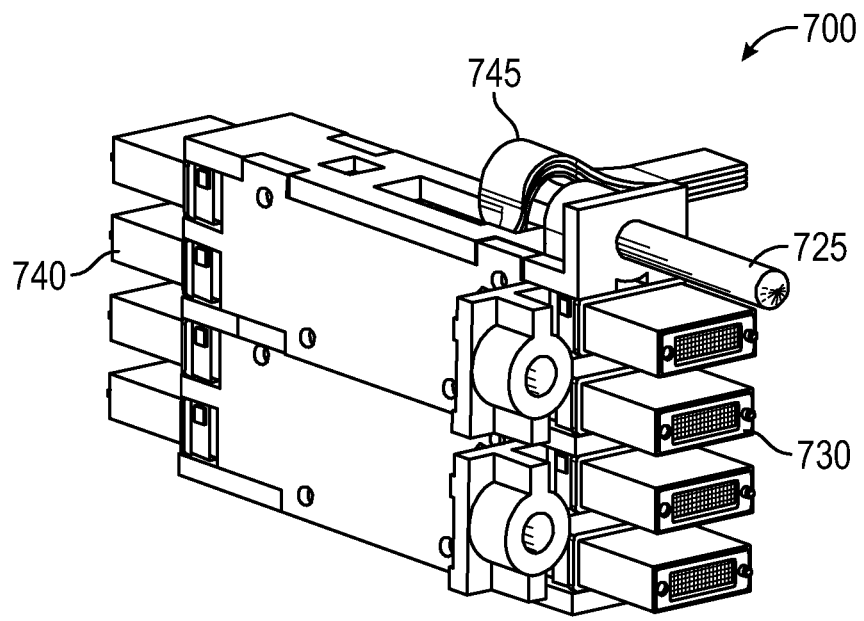
FIG. 7A is a perspective view of a ferrule-based blindmate optical connector according to one or more examples.
Figure 7B:
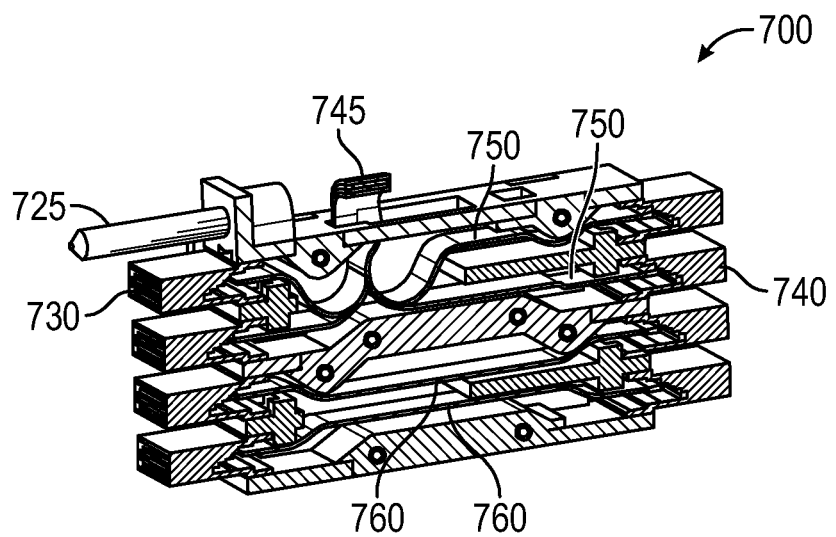
FIG. 7B is a cross-sectional view of a ferrule-based blindmate optical connector according to one or more examples.

In FIGS. 1A-6B described above, the optical connectors are shown as ferrule-based blindmate optical connectors. An example of a ferrule-based blind mate optical connector is shown in FIGS. 7A and 7B. FIG. 7A is a perspective view of a ferrule-based blindmate optical connector 700, and FIG. 7B is a cross-sectional view of a ferrule-based blindmate optical connector 700.

As shown in FIG. 7A, a ferrule-based blindmate optical connector 700 includes ferrules 730 on a first side and ferrules 740 on a second side. The ferrule-based optical connector 700 may be positioned on an airframe, such as the airframe 110 depicted in FIGS. 1A-1B. Referring to FIGS. 1A, 1B, and FIG. 7A, the ferrule based optical connector 700 may be positioned on the airframe 110, such that the ferrules 730 extend from the first side 105A of the airframe 110 shown in FIG. 1A towards first modules disposed on the first side 105A of the airframe, and the ferrules 740 extend from the second side 105B of the airframe 110 shown in FIG. 1B towards second modules disposed on the second side 105B of the airframe 110.

Referring now to FIGS. 7A and 7B, with continued reference to FIGS. 1A and 1B, the ferrule-based blindmate optical connector 700 includes an optical connector alignment component 725 to facilitate alignment of the optical connector 700 relative to first modules disposed on the first side 105A of the airframe 110. The optical connector alignment component 725 may include, for example, a pin extending from the optical connector 700 towards the first modules. Although not shown, the ferrule-based blindmate optical connector 700 may also include an optical connector alignment component on an opposite side to facilitate alignment of the optical connector 700 relative to the second module disposed on the second side 105B of the airframe 110.

As shown in FIG. 7B with continued reference to FIGS. 1A and 1B, the ferrule-based optical blindmate connector 700 includes optical fibers 750 for cross connections between first modules and second modules disposed in different hemispheres, first modules disposed in different hemispheres, and second modules disposed in different hemispheres. Examples of different hemispheres A and B are shown and described above with reference to FIGS. 2A, 2B, 4, and 5. A cross-connect optical fiber bundle 745 of the optical fibers 750 facilitates interconnection of the ferrule-based optical blindmate connector 700 with other ferrule-based optical blindmate connectors via optical fibers disposed in the airframe 110. The ferrule-based optical blindmate connector 700 also includes fibers 760 for a straight connection between first modules and second modules disposed in the same hemisphere.

Having described ferrule-based optical connectors, it should be appreciated that the optical connectors described above with reference to FIGS. 1A-6B may include other types of optical connectors, such as glass-based optical blindmate connectors that include waveguides instead of optical fibers for transmitting optical signals. Waveguides may be laser-written and inscribed within glass materials. The waveguides may be relatively thin and in closer proximity compared to optical fibers. Therefore, more waveguides may be implemented within the same volumetric as compared to optical fibers. This may be advantageous for increasing bandwidth. In addition, glass waveguides may be easier to be manufactured with automated processes and therefore may be less costly to produce. An example block diagram of a glass-based optical blindmate connector 800 is shown in FIG. 8.

A glass-based optical blindmate connector 800 may be positioned on an airframe, such as the airframe 110 depicted in FIGS. 1A-1B. Referring to FIGS. 1A, 1B, and FIG. 8, the glass-based optical blindmate connector 800 includes optical waveguides 820 and 830 that provide optical connectivity between first modules disposed on the first side 105A of the airframe 110 and second modules disposed on the second side 105B of the airframe 110. As those skilled in the art would appreciate, the optical waveguides 820 and 830 may be inscribed in glass using, e.g., a laser. The glass-based optical blindmate connector 800 includes module interfaces 840A and 840B to couple to the first modules and the second modules, respectively.

Figure 8:
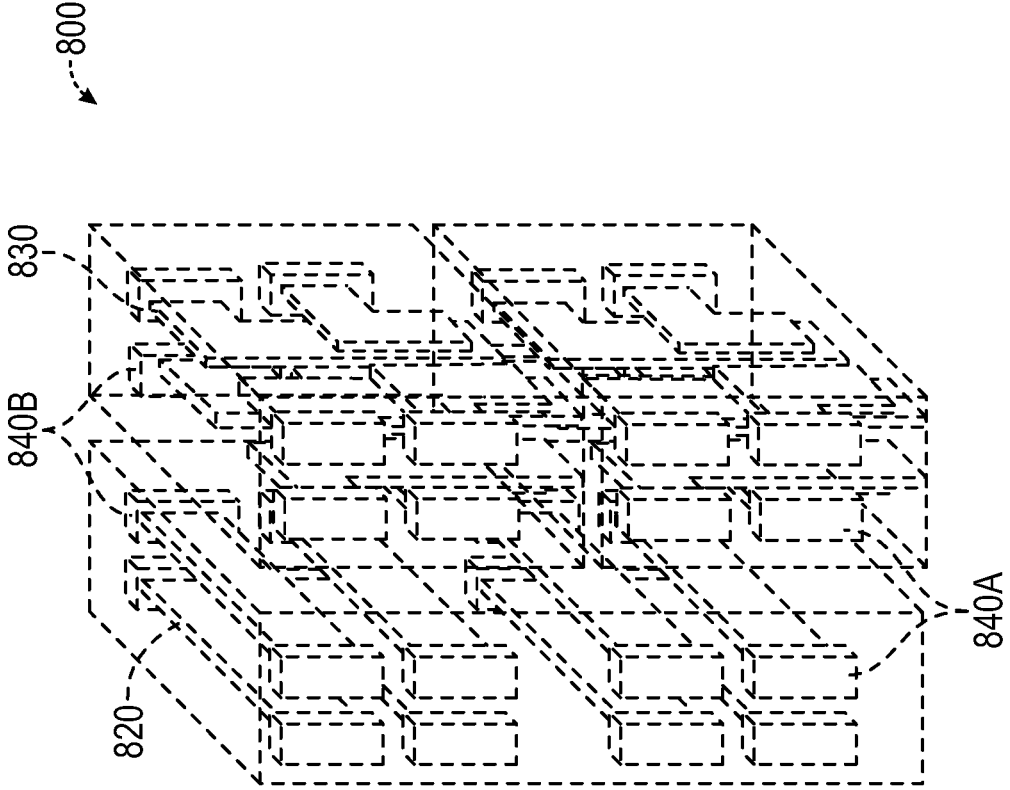
FIG. 8 illustrates a glass-based optical blindmate connector according to one or more examples.

As shown in FIG. 8 with continued reference to FIGS. 1A and 1B, the optical waveguides 820 provide straight connections between first modules and second modules disposed in the same hemisphere. The optical waveguides 830 provide for cross connections between first modules and second modules disposed in different hemispheres, first modules disposed in different hemispheres, and second modules disposed in different hemispheres. Examples of different hemispheres A and B are shown and described above with reference to FIGS. 2A, 2B, 4, and 5

Figure 9:
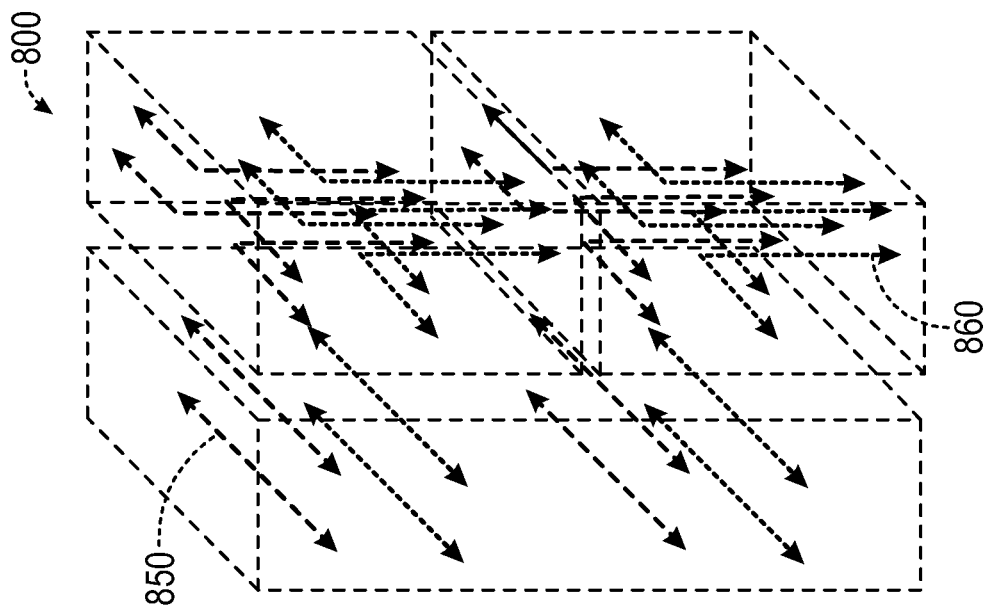
FIG. 9 illustrates signal paths of a glass-based optical blindmate connector according to one or more examples.

FIG. 9 illustrates optical signal paths of a glass-based optical blindmate connector 800 according to one or more examples. As shown in FIG. 9 with continued reference to FIG. 8, optical signals flow along straight paths 850 within the optical waveguides 820, and optical signals flow along cross-connecting paths 860 within the optical waveguides 830.

Figure 10:
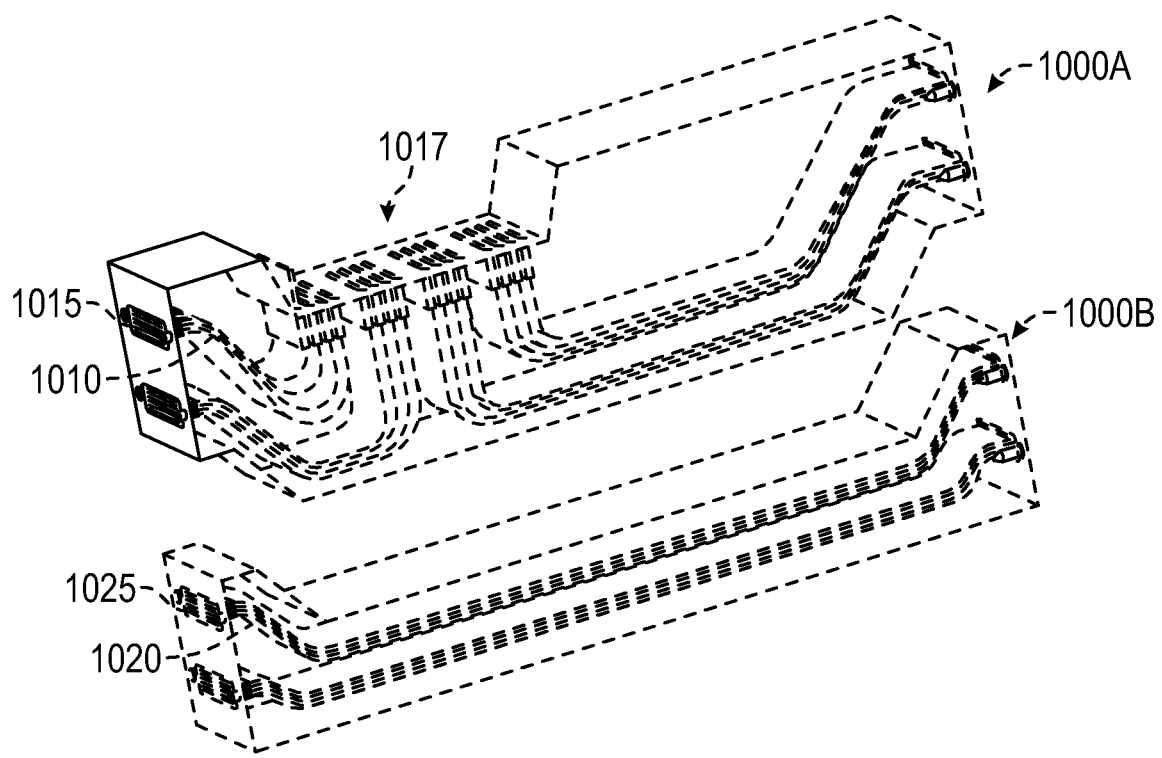
FIG. 10 illustrates perspective views of glass-based optical blindmate connectors according to one or more examples.

FIG. 10 illustrates perspective views of glass-based optical blindmate connectors 1000A and 1000B according to one or more examples. The glass-based optical blindmate connectors 1000A and 1000B may be positioned on an airframe, such as the airframe 110 depicted in FIGS. 1A-1B. Referring to FIGS. 1A, 1B, and FIG. 10 the glass-based optical blindmate connector 1000A includes module interfaces 1015 disposed on opposite sides to interface with first modules and second modules respectively disposed on the first side 105A and the second side 105B of the airframe 110 depicted in FIGS. 1A and 1B. Similarly, the glass-based optical blindmate connector 1000B includes module interfaces 1025 disposed on opposite sides to interface with first modules and second modules respectively disposed on the first side 105A and the second side 105B of the airframe 110 depicted in FIGS. 1A-1B.

As shown in FIG. 10 with continued reference to FIGS. 1A and 1B, the glass-based optical blindmate connector 1000A includes waveguides 1010 and cross-connect optical fiber interfaces 1017 for cross connections between first modules and second modules disposed in different hemispheres, first modules disposed in different hemispheres, and second modules disposed in different hemispheres. Examples of different hemispheres A and B are shown and described above with reference to FIGS. 2A, 2B, 4, and 5. The cross-connector optical fiber interfaces 1017 facilitate interconnection between the glass-based optical blindmate connector 1000A and other glass based optical blindmate connectors disposed on the airframe 110 via optical fibers.

As shown in FIG. 10, the glass-based optical blindmate connector 1000B includes waveguides 1020 to provide straight connections between first modules and second modules disposed in the same hemisphere.

Figure 11:
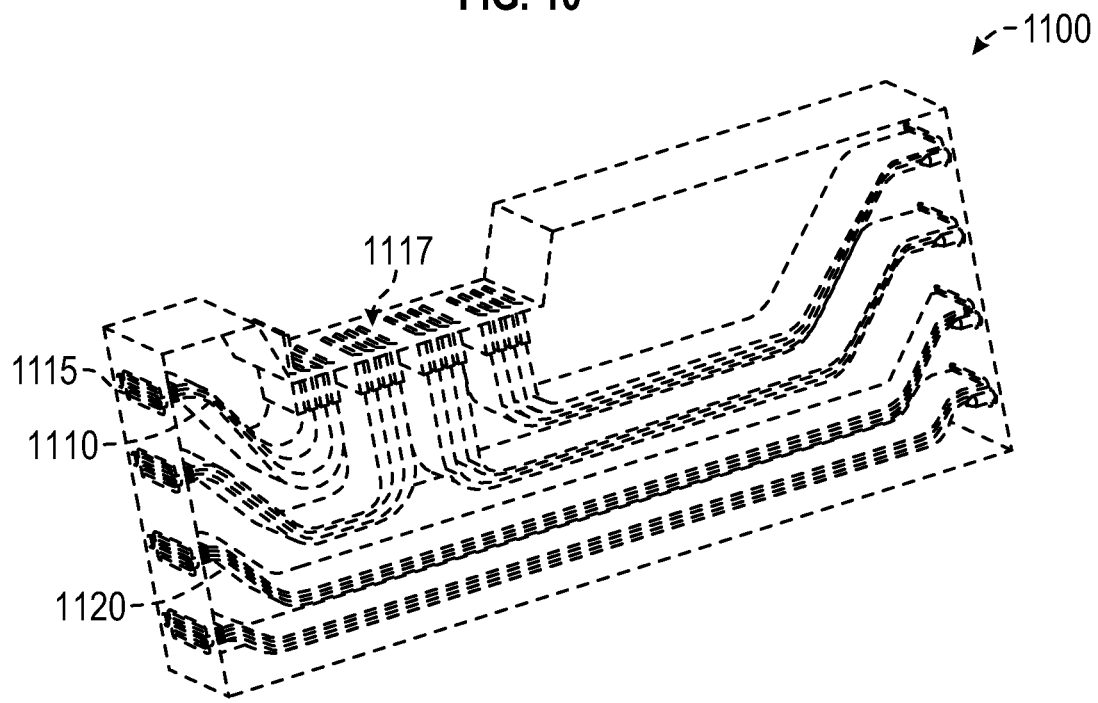
FIG. 11 illustrates a perspective view of a monolithic glass-based optical blindmate connector according to one or more examples.

The glass-based optical blindmate connectors 1000A and 1000B may be used in combination to provide cross connections and straight connections. Instead of using separate glass-based optical blindmate connectors for cross connection and straight connections, one monolithic glass-based optical blindmate connector 1100 may be used as shown in FIG. 11 according to one or more examples. The monolithic glass-based optical blindmate connector 1100 may be positioned on an airframe, such as the airframe 110 depicted in FIGS. 1A-1B.

Referring to FIGS. 1A, 1B, and FIG. 11, the monolithic glass-based optical blindmate connector 1100 includes module interfaces 1115 on opposite sides to interface with first modules and second modules respectively disposed on the first side 105A and the second side 105B of the airframe 110 depicted in FIGS. 1A and 1B. As shown in FIG. 11 with continued reference to FIGS. 1A and 1B, the monolithic glass-based optical blindmate connector 1100 includes waveguides 1110 and cross-connect optical fiber interfaces 1117 for cross connections between first modules and second modules disposed in different hemispheres, first modules disposed in different hemispheres, and second modules disposed in different hemispheres. Examples of different hemispheres A and B are shown and described above with reference to FIGS. 2A, 2B, 4, and 5. The cross-connect optical fiber interfaces 1117 facilitate interconnection between the monolithic glass-based optical blindmate connector 1100 and other glass based optical blindmate connectors disposed on the airframe 110 via optical fibers.

The monolithic glass-based optical blindmate connector 1100 also includes waveguides 1120 to provide straight connections between first modules and second modules disposed in the same hemisphere.

According to some examples, the optical fibers that cross-connect the glass-based optical blindmate connectors via the cross-connect optical interfaces may be in the form of optical fiber arrays. To accommodate connection of the optical fiber arrays to the glass-based blindmate optical connectors, the cross-connect optical interfaces may be formed as a v-groove. This may be understood with reference to FIGS. 12A and 12B.

Figure 12A:
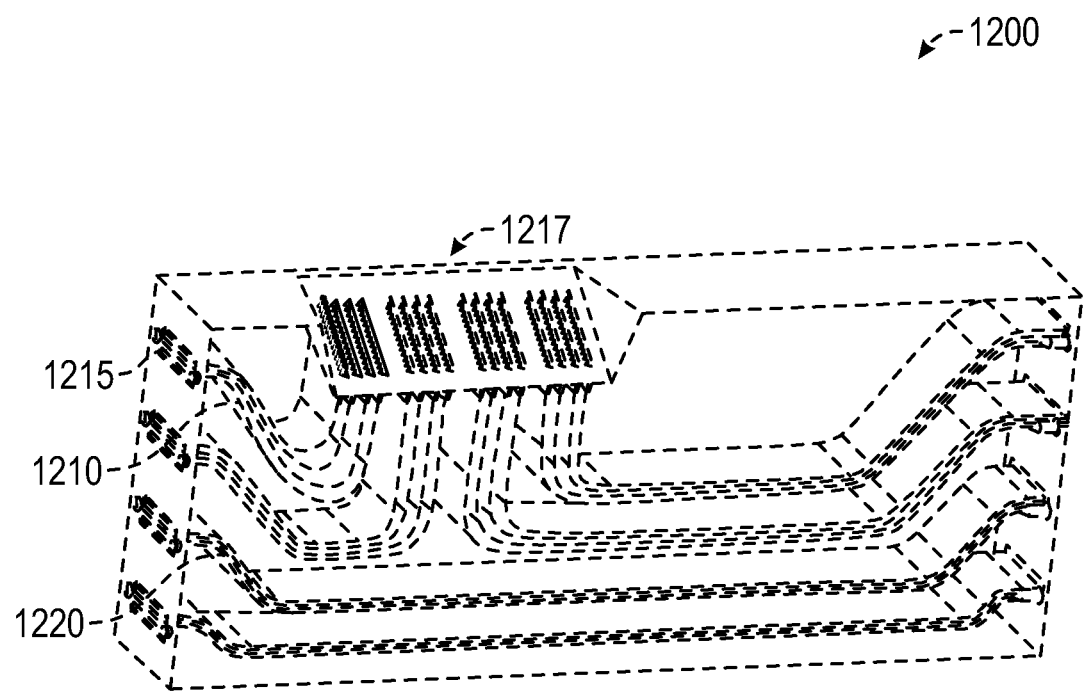
FIG. 12A illustrates a perspective view of a monolithic glass-based optical blindmate connector with sloped waveguide routing planes according to one or more examples.
Figure 12B:
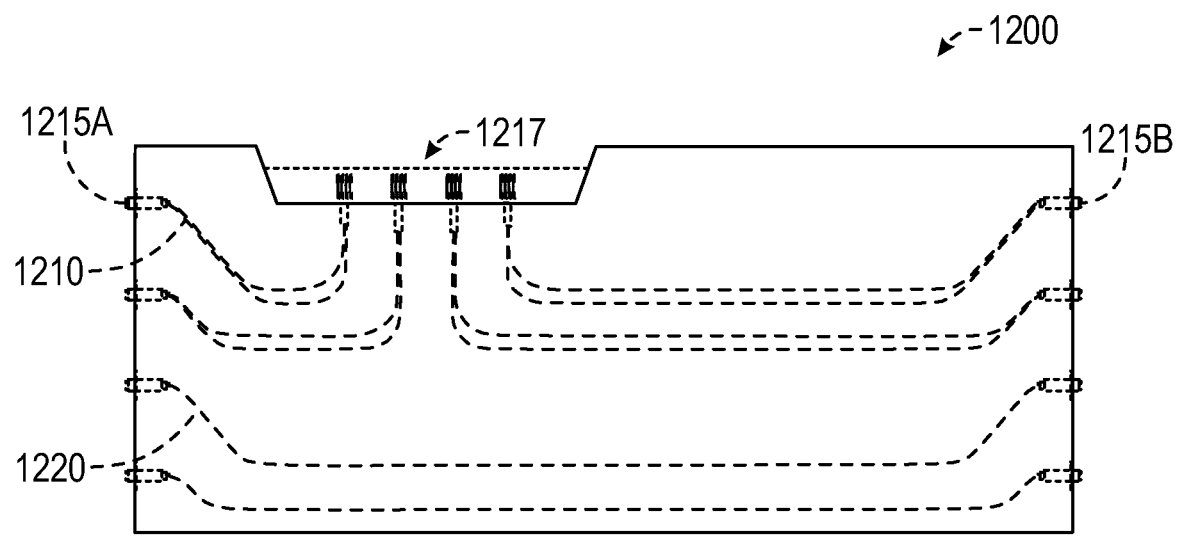
FIG. 12B illustrates a cross-sectional view of the monolithic glass-based optical blindmate connector of FIG. 12A with sloped waveguide routing planes.

FIGS. 12A and 12B respectively illustrate a perspective view and a cross-sectional view of a monolithic glass-based optical blindmate connector 1200 with a v-groove cross-connect optical fiber interface 1217 according to one or more examples. The monolithic glass-based optical blindmate connector 1200 may be positioned on an airframe, such as the airframe 110 depicted in FIGS. 1A-1B. In other examples, an optical connector structure may be used instead of v-grooves for the cross-connect optical fiber interface 1217.

Referring to FIGS. 1A, 1B, and 12B, the monolithic glass-based optical blindmate connector 1200 includes module interfaces 1215A and 1215B to interface with first modules and second modules respectively disposed on the first side 105A and the second side 105B of the airframe 110 depicted in FIGS. 1A and 1B. As shown in FIGS. 12A and 12B with continued reference to FIGS. 1A and 1B, the monolithic glass-based optical blindmate connector 1200 includes waveguides 1210 and cross-connect optical fiber interfaces 1217 for cross connections between first modules and second modules disposed in different hemispheres, first modules disposed in different hemispheres, and second modules disposed in different hemispheres. Examples of different hemispheres A and B are shown and described above with reference to FIGS. 2A, 2B, 4, and 5. The cross-connector optical fiber interfaces 1217 facilitate interconnection between the glass-based optical blindmate connector 1200 and other glass based optical blindmate connectors disposed on the airframe 110 via optical fibers.

As can be seen from FIG. 12A, the cross-connector optical fiber interfaces 1217 are formed as v-grooves. The v-grooves 1217 facilitate positioning of optical fiber array precisely with respect to the waveguides 1210. In particular, the optical fibers of an optical fiber array may be positioned in the v-grooves and covered with a glass lid (not shown). Additionally, although not shown, it should be appreciated that epoxy filling slots may be provided through which epoxy may be applied to the optical fibers to adhere the optical fibers to the v-grooves. The epoxy may be cured by ultraviolet (UV) light.

As shown in FIGS. 12A and 12B, the waveguides 1210 are disposed in sloped waveguide routing planes. The sloped waveguide routing planes allow the optical fibers that interconnect the monolith glass-based optical blindmate connector 1200 with other glass-based optical connectors to terminate at the monolithic glass-based optical blindmate connector 1200 at an angle such that the bend radii of the optical fibers are minimized. This allows for ease of routing of the optical fibers within the airframe 110.

The monolithic glass-based optical blindmate connector 1200 also includes waveguides 1220 to provide straight connections between first modules and second modules disposed in the same hemisphere.

The foregoing description, for purposes of explanation, used specific nomenclature to provide a thorough understanding of the disclosure. However, it will be apparent to one skilled in the art that the specific details are not required in order to practice the systems and methods described herein. The foregoing descriptions of specific examples are presented for purposes of illustration and description. They are not intended to be exhaustive of or to limit this disclosure to the precise forms described. Many modifications and variations are possible in view of the above teachings. The examples are shown and described in order to best explain the principles of this disclosure and practical applications, to thereby enable others skilled in the art to best utilize this disclosure and various examples with various modifications as are suited to the particular use contemplated. It is intended that the scope of this disclosure be defined by the claims and their equivalents below.

What is claimed is:

1. An optical midplane, comprising:
   an airframe having a first side on which first modules are disposed and a second side on which second modules are disposed, the airframe to provide for optimized airflow through the first modules disposed on the first side with air flowing through shutters on an electrical midplane to which the airframe is coupled; and
   a plurality of optical connectors disposed at respective locations on the airframe, the second side of the airframe resting on the electrical midplane such that the optical connectors extend through the electrical midplane towards the second modules to provide optical connectivity between at least one of:
   any first module disposed on the first side of the airframe and any second module disposed on the second side of the airframe;
   any first modules disposed on the first side of the airframe; and
   any second modules disposed on the second side of the airframe.

2. The optical midplane of claim 1, wherein the optical connectors disposed on the airframe are interconnected by optical fibers.

3. The optical midplane of claim 1, wherein the optical connectors include ferrule-based connectors.

4. The optical midplane of claim 3, wherein the ferrule-based connectors include at least one of a physical contact mechanical transfer (MT) ferrule, an air-gap MT, a lens MT and a duplex ferrule.

5. The optical midplane of claim 1, wherein the optical connectors include glass-based blindmate optical connectors.

6. The optical midplane of claim 5, wherein the glass-based blindmate optical connectors include waveguides inscribed in glass.

7. The optical midplane of claim 6, wherein at least some of the waveguides have sloped surfaces.

8. The optical midplane of claim 1, further comprising a tag disposed on the airframe to store information corresponding to a connection scheme of the optical connectors.

9. An assembly, comprising:
   an airframe having a first side on which first modules are disposed in a first hemisphere and a second hemisphere and a second side on which second modules are disposed in the first hemisphere and the second hemisphere, the airframe to provide for optimized airflow through the first modules disposed on the first side with air flowing through shutters on an electrical midplane to which the airframe is coupled;
   a plurality of optical connectors, the second side of the airframe resting on the electrical midplane such that the optical connectors extend through the electrical midplane towards the second modules to connect:
   a first module disposed in the first hemisphere on the first side of the airframe to a second module disposed in the first hemisphere on the second side of the airframe; and
   the first module disposed in the first hemisphere on the first side of the airframe to another second module disposed in the second hemisphere on the second side of the airframe; and
   optical fibers to interconnect the optical connectors.

10. The assembly of claim 9, wherein the plurality of optical connectors is further to connect the first module disposed in the first hemisphere on the first side of the airframe to another first module disposed in the second hemisphere on the first side of the airframe.

11. The assembly of claim 9, wherein the plurality of optical connectors is further to connect the second module disposed in the first hemisphere on the second side of the airframe to the other second module disposed in the second hemisphere on the second side of the airframe.

12. The assembly of claim 9, wherein the optical connectors include ferrule-based blindmate connectors.

13. The assembly of claim 9, wherein the optical connectors include glass-based blindmate optical connectors.

14. The assembly of claim 13, wherein the glass-based blindmate optical connectors include laser-written waveguides inscribed in glass.

15. A system, comprising:
an electrical midplane;
an airframe having a first side on which first modules are disposed and a second side on which second modules are disposed, the airframe to provide for optimized airflow through the first modules disposed on the first with air flowing through shutters on an electrical midplane to which the airframe is coupled; and
a plurality of optical connectors disposed at respective locations on the airframe, the second side of the airframe resting on the electrical midplane such that the optical connectors extend through the electrical midplane towards the second modules to provide optical connectivity between at least one of:
any first module disposed on the first side of the airframe and any second module disposed on the second side of the airframe;
any first modules disposed on the first side of the airframe; and
any second modules disposed on the second side of the airframe.

16. The system of claim 15, further comprising optical fibers to interconnect the optical connectors disposed on the airframe.

17. The system of claim 16, wherein the optical connectors include ferrule-based blindmate optical connectors or glass-based blindmate optical connectors.

18. The system of claim 15, wherein the electrical midplane includes electrical midplane alignment components to provide alignment of the electrical midplane relative to the second modules.

19. The system of claim 15, where the electrical midplane includes electrical midplane alignment components to provide alignment of the electrical midplane relative to the first modules.

20. The system of claim 15, wherein the optical connectors include optical connector alignment components to provide alignment of the optical connectors relative to the first modules and the second modules.

* * * * *